US009572259B2

(12) United States Patent
Terada et al.

(10) Patent No.: US 9,572,259 B2
(45) Date of Patent: Feb. 14, 2017

(54) SUSPENSION BOARD WITH CIRCUIT

(71) Applicant: NITTO DENKO CORPORATION, Osaka (JP)

(72) Inventors: Naohiro Terada, Osaka (JP); Yoshito Fujimura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/755,173

(22) Filed: Jun. 30, 2015

(65) Prior Publication Data
US 2016/0007458 A1    Jan. 7, 2016

(30) Foreign Application Priority Data
Jul. 7, 2014   (JP) ................. 2014-139678

(51) Int. Cl.
*H05K 1/00* (2006.01)
*H05K 1/18* (2006.01)
*H05K 1/02* (2006.01)

(52) U.S. Cl.
CPC ............ *H05K 1/181* (2013.01); *H05K 1/0281* (2013.01); *H05K 1/189* (2013.01); *H05K 2201/0394* (2013.01); *H05K 2201/2009* (2013.01)

(58) Field of Classification Search
CPC .............. H05K 1/00; H05K 1/05; H05K 1/11; H05K 1/14; H05K 1/18; H05K 3/10; H05K 3/22; H05K 3/24; H05K 3/38; H05K 3/36; H05K 3/42; H05K 3/44
USPC ............ 174/268, 250, 251, 254, 255, 258, 260, 174/261, 262; 361/760, 803
See application file for complete search history.

(56) References Cited

U.S. PATENT DOCUMENTS

| | | | |
|---|---|---|---|
| 2002/0007961 A1* | 1/2002 | Yamato et al. ............... | 174/250 |
| 2005/0061542 A1* | 3/2005 | Aonuma et al. .............. | 174/255 |
| 2007/0170911 A1* | 7/2007 | Ohsawa et al. ............ | 324/158.1 |
| 2007/0295534 A1* | 12/2007 | Ishii et al. ..................... | 174/261 |
| 2008/0029293 A1* | 2/2008 | Ooyabu et al. ............... | 174/250 |
| 2008/0115962 A1* | 5/2008 | Juni et al. ...................... | 174/250 |
| 2008/0190652 A1* | 8/2008 | Kamei et al. ................. | 174/250 |
| 2009/0014410 A1* | 1/2009 | Yokai et al. .................... | 216/17 |
| 2009/0101399 A1* | 4/2009 | Iguchi et al. ................. | 174/260 |
| 2009/0151994 A1* | 6/2009 | Ohsawa et al. ............... | 174/261 |

(Continued)

FOREIGN PATENT DOCUMENTS

JP    2012-099204 A    5/2012

*Primary Examiner* — Xiaoliang Chen
(74) *Attorney, Agent, or Firm* — Jean C. Edwards, Esq.; Edwards Neils LLC

(57) ABSTRACT

A suspension board with circuit includes a metal supporting board having a support opening portion passing through a thickness direction; a base insulating layer disposed on an upper surface of the metal supporting board and having an insulating opening portion passing through the thickness direction, when projected in the thickness direction, to be included in the support opening portion; and a conductive layer having a wire portion disposed on an upper surface of the base insulating layer and a terminal portion disposed in the insulating opening portion to be connected to an electronic element and connected to the wire portion. The base insulating layer has a cutout portion obtained by cutting out the base insulating layer in a direction orthogonal to the thickness direction and continuous to the insulating opening portion and the terminal portion includes a terminal free end portion opened by the cutout portion.

8 Claims, 9 Drawing Sheets

(56) References Cited

U.S. PATENT DOCUMENTS

| | | | |
|---|---|---|---|
| 2009/0261060 A1* | 10/2009 | Mizushima et al. | 216/13 |
| 2009/0277868 A1* | 11/2009 | Ishii et al. | 216/13 |
| 2010/0032201 A1* | 2/2010 | Ooyabu et al. | 174/262 |
| 2010/0110590 A1* | 5/2010 | Ohsawa et al. | 360/234.5 |
| 2010/0110649 A1* | 5/2010 | Ohsawa et al. | 361/760 |
| 2010/0157560 A1* | 6/2010 | Kanagawa et al. | 361/803 |
| 2011/0286132 A1* | 11/2011 | Ishii | 360/246.2 |
| 2012/0087041 A1 | 4/2012 | Ohsawa | |
| 2012/0113547 A1* | 5/2012 | Sugimoto | 360/245.8 |
| 2012/0175151 A1* | 7/2012 | Mizutani | 174/250 |
| 2012/0211263 A1* | 8/2012 | Mizutani | 174/250 |
| 2013/0020112 A1* | 1/2013 | Ohsawa | 174/255 |
| 2013/0105208 A1* | 5/2013 | Higuchi et al. | 174/258 |
| 2013/0215726 A1* | 8/2013 | Fujimura et al. | 369/13.24 |
| 2013/0248233 A1* | 9/2013 | Kanezaki et al. | 174/260 |
| 2013/0319748 A1* | 12/2013 | Ishii et al. | 174/262 |
| 2013/0342936 A1* | 12/2013 | Nishiyama et al. | 360/244 |
| 2014/0153373 A1* | 6/2014 | Fujimura et al. | 369/13.32 |
| 2014/0353007 A1* | 12/2014 | Ichinose et al. | 174/251 |

* cited by examiner

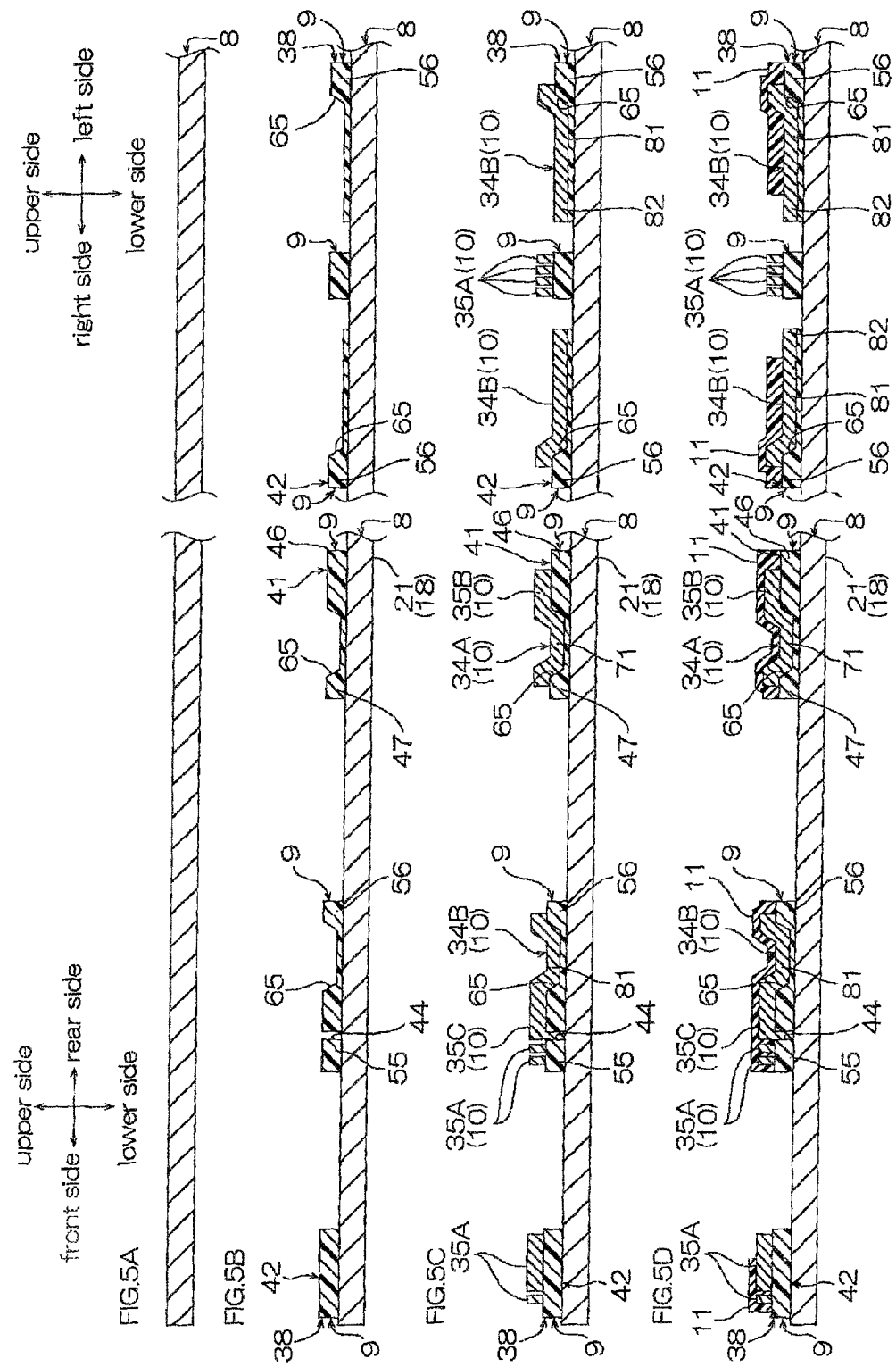

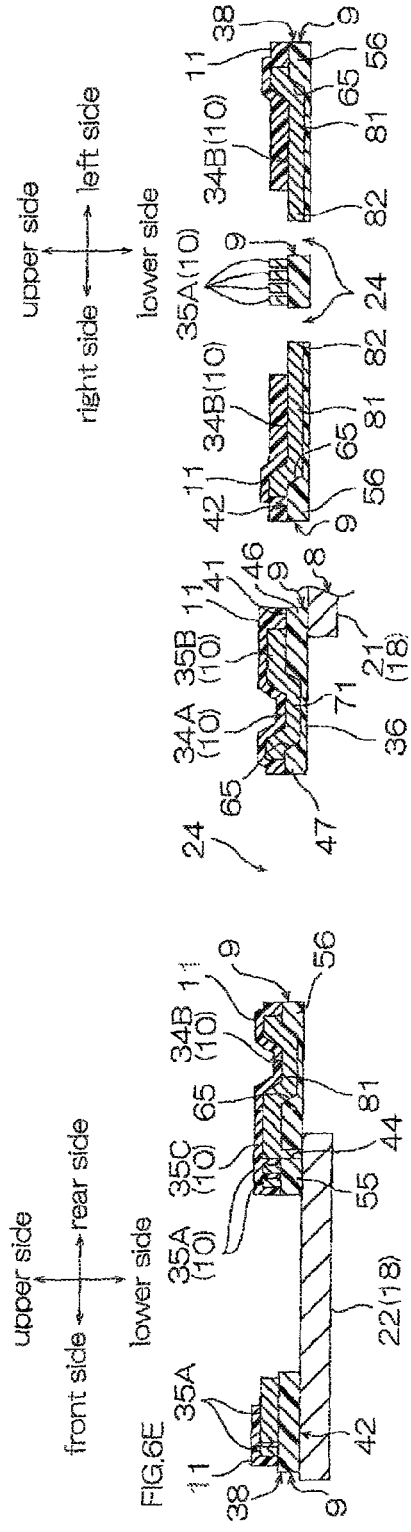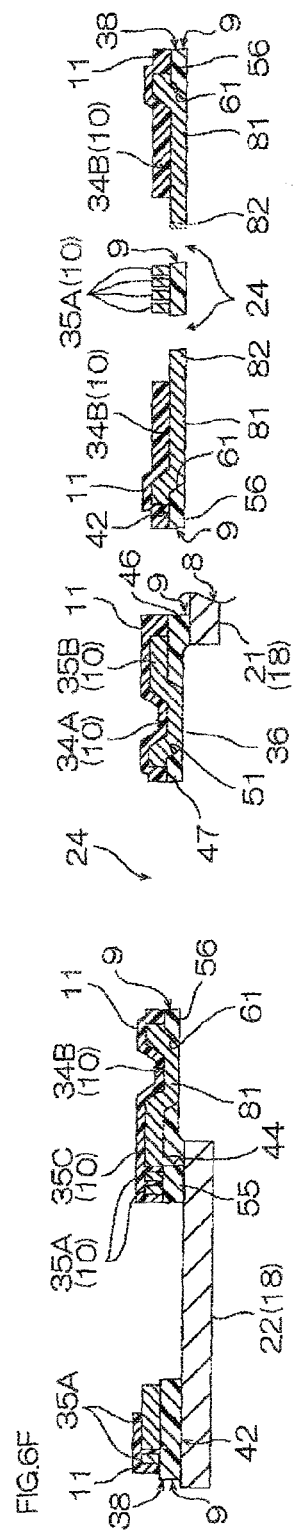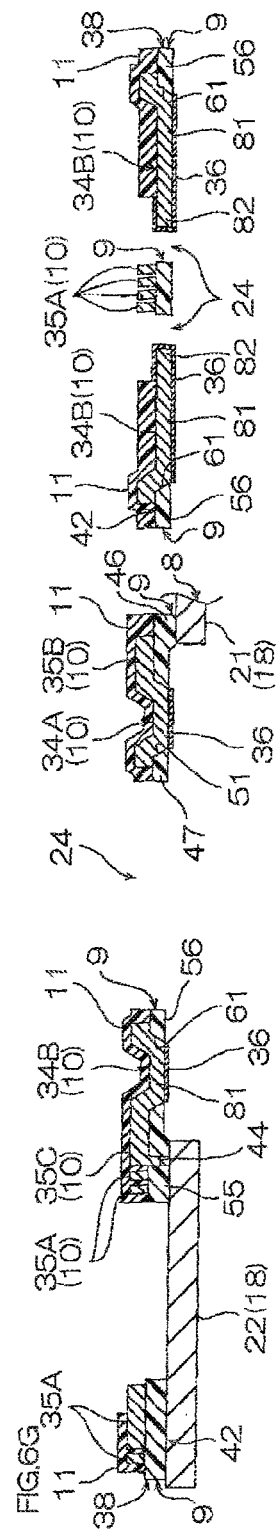

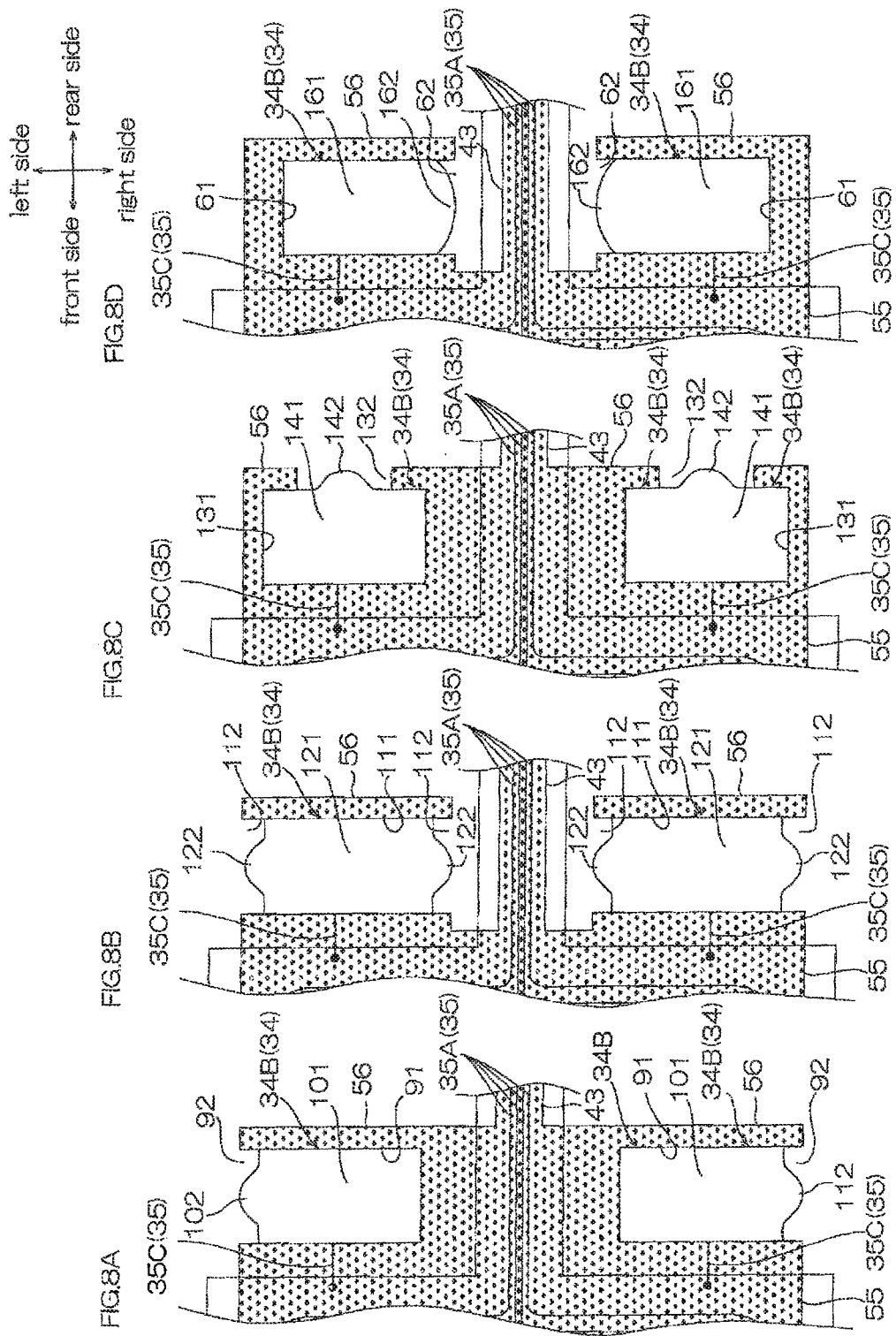

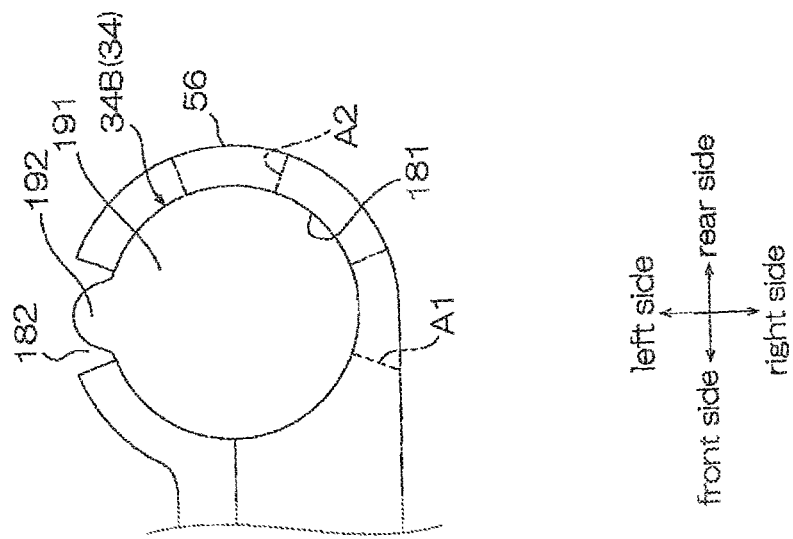
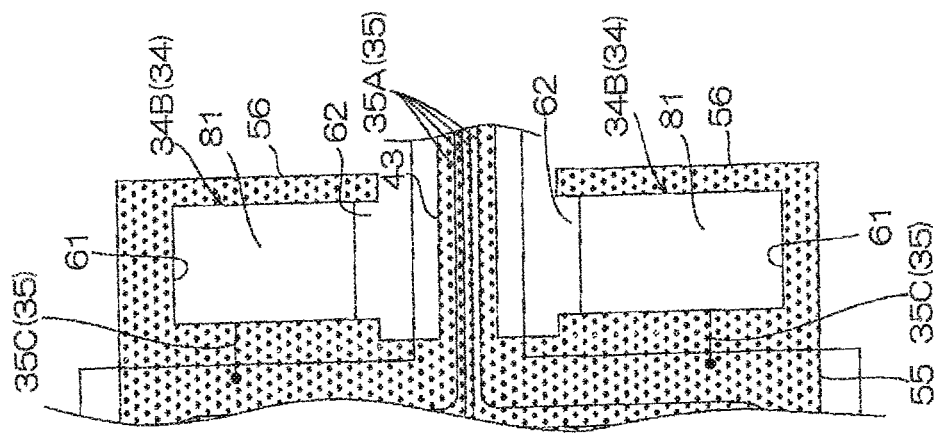

SUSPENSION BOARD WITH CIRCUIT

CROSS-REFERENCE TO RELATED APPLICATION

The present application claims priority from Japanese Patent Application No. 2014-139678 filed on Jul. 7, 2014, the contents of which are hereby incorporated by reference into this application.

BACKGROUND OF THE INVENTION

Field of the Invention

The present invention relates to a suspension board with circuit, to be specific, to a suspension board with circuit used in a hard disk drive.

Description of Related Art

As a suspension board with circuit used in a hard disk drive, a suspension board with circuit mounted with a piezoelectric element along with a magnetic head in order to adjust the position and the angle of the magnetic head has been recently known.

In such a suspension board with circuit, a piezoelectric terminal connected to the piezoelectric element is formed. When electricity is supplied to the piezoelectric element via the piezoelectric terminal, the suspension board with circuit swings by stretching and shrinking of the piezoelectric element. In this manner, in the suspension board with circuit, the accuracy of the position and the angle of the magnetic head with respect to a hard disk is improved (ref: for example, Japanese Unexamined Patent Publication No. 2012-99204).

SUMMARY OF THE INVENTION

In the suspension board with circuit described in Japanese Unexamined Patent Publication No. 2012-99204, however, distortion occurs between the piezoelectric terminal and the piezoelectric element by swinging of the suspension board with circuit, so that the connection reliability therebetween may be reduced.

It is an object of the present invention to provide a suspension board with circuit capable of improving connection reliability between an electronic element and a terminal portion.

[1] A suspension board with circuit of the present invention includes a metal supporting board having a support opening portion passing through a thickness direction; a base insulating layer disposed on an upper surface of the metal supporting board and having an insulating opening portion passing through the thickness direction, when projected in the thickness direction, to be included in the support opening portion; and a conductive layer having a wire portion disposed on an upper surface of the base insulating layer and a terminal portion disposed in the insulating opening portion to be connected to an electronic element and connected to the wire portion, wherein the base insulating layer has a cutout portion obtained by cutting out the base insulating layer in a direction orthogonal to the thickness direction and continuous to the insulating opening portion and the terminal portion includes a terminal free end portion opened by the cutout portion.

According to the suspension board with circuit, the cutout portion is formed by cutting out the base insulating layer in the direction orthogonal to the thickness direction and is continuous to the insulating opening portion. The terminal free end portion of the terminal portion is opened from the base insulating layer by the cutout portion.

Thus, the bonded area with the electronic element in the terminal portion can be increased by the terminal free end portion.

As a result, the connection reliability of the electronic element with the terminal portion can be improved.

[2] In the suspension board with circuit of the present invention described in the above-described [1], the electronic element is a piezoelectric element and the terminal portion is displaced by stretching and shrinking of the piezoelectric element.

According to the suspension board with circuit, even when swinging of the suspension board with circuit by stretching and shrinking of the piezoelectric element causes distortion between the electronic element and the terminal portion, the bonded area of the electronic element with the terminal portion can be increased, so that the connection reliability of the electronic element with the terminal portion can be improved.

[4] In the suspension board with circuit of the present invention described in the above-described [1] or [2], the cutout portion is formed by cutting out at least one side of the base insulating layer in a widthwise direction orthogonal to both directions of a connection direction of the wire portion and the terminal portion and the thickness direction.

When the suspension board with circuit swings in the widthwise direction by stretching and shrinking of the piezoelectric element, distortion in the widthwise direction occurs between the electronic element and the terminal portion.

According to the suspension board with circuit, the cutout portion is formed by cutting out the base insulating layer in the widthwise direction, so that the distortion occurring in the widthwise direction can be alleviated in the cutout portion.

[4] In the suspension board with circuit of the present invention described in any one of the above-described [1] to [3], the cutout portion is formed by cutting out at least one side of the base insulating layer in a connection direction of the wire portion and the terminal portion.

When the suspension board with circuit swings in the widthwise direction by stretching and shrinking of the piezoelectric element, distortion in the widthwise direction occurs between the electronic element and the terminal portion.

According to the suspension board with circuit, the cutout portion is formed by cutting out at least one side of the base insulating layer in the connection direction of the wire portion and the terminal portion, so that the cutout portion can be disposed in a portion with less distortion of the piezoelectric element.

Thus, the connection reliability of the terminal free end portion opened from the base insulating layer by the cutout portion with respect to the electronic element can be improved.

[5] In the suspension board with circuit of the present invention described in any one of the above-described [1] to [4], the terminal free end portion is a protruding portion that protrudes toward the cutout portion.

According to the suspension board with circuit, the bonded area of the terminal portion can be further increased by the protruding portion in the terminal portion.

Thus, the connection reliability of the terminal portion can be further improved.

[6] In the suspension board with circuit of the present invention described in any one of the above-described [1] to

[5], the suspension board with circuit further includes a cover insulating layer disposed to cover the conductive layer on the upper surface of the base insulating layer and an end edge of the terminal free end portion is, when projected in the thickness direction, disposed at a one direction-side with respect to an end edge of the cover insulating layer in one direction from the insulating opening portion toward the cutout portion.

When the end edge of the cover insulating layer is disposed at the one direction-side with respect to the end edge of the terminal free end portion in one direction from the insulating opening portion toward the cutout portion, the end edge of the cover insulating layer is over that of the terminal free end portion, so that the cover insulating layer is easily peeled from the terminal portion.

According to the suspension board with circuit, the end edge of the terminal free end portion is, when projected in the thickness direction, disposed at the one direction-side with respect to the end edge of the cover insulating layer in one direction from the insulating opening portion toward the cutout portion, so that the end edge of the cover insulating layer can be brought into tight contact with the terminal portion, thereby suppressing the peeling of the cover insulating layer from the terminal portion.

BRIEF DESCRIPTION OF THE DRAWINGS

FIGS. 5A to 5D show process drawings for illustrating a method for producing a suspension board with circuit:

FIG. 5A illustrating a step of preparing a metal supporting board,

FIG. 5B illustrating a step of forming a base insulating layer,

FIG. 5C illustrating a step of forming a conductive layer, and

FIG. 5D illustrating a step of forming a cover insulating layer.

FIGS. 6E to 6G subsequent to FIG. 5D, show process drawings for illustrating a method for producing a suspension board with circuit:

FIG. 6E illustrating a step of trimming the metal supporting board,

FIG. 6F illustrating a step of partially removing the base insulating layer, and FIG. 6G illustrating a step of forming a plating layer.

FIGS. 8A to 8D show plan views for illustrating modified examples of a suspension board with circuit of the present invention:

FIG. 8A illustrating a plan view showing piezoelectric terminals and rear-side stage insulating layers of a second embodiment of a suspension board with circuit of the present invention, FIG. 8B illustrating a plan view showing piezoelectric terminals and rear-side stage insulating layers of a third embodiment of a suspension board with circuit, of the present invention, FIG. 8C illustrating a plan view showing piezoelectric terminals and rear-side stage insulating layers of a fourth embodiment of a suspension board with circuit of the present invention, and FIG. 8D illustrating a plan view showing piezoelectric terminals and rear-side stage insulating layers of a fifth embodiment of a suspension board with circuit of the present invention.

FIGS. 9A and 9B show plan views for illustrating modified examples of a suspension board with circuit of the present invention:

FIG. 9A illustrating a plan view showing piezoelectric terminals and rear-side stage insulating layers of a sixth embodiment of a suspension board with circuit of the present invention and FIG. 9B illustrating a plan view showing a piezoelectric terminal and a rear-side stage insulating layer of a seventh embodiment of a suspension board with circuit of the present invention.

DETAILED DESCRIPTION OF THE INVENTION

1. Entire Configuration of Suspension Board with Circuit

Figure 1:
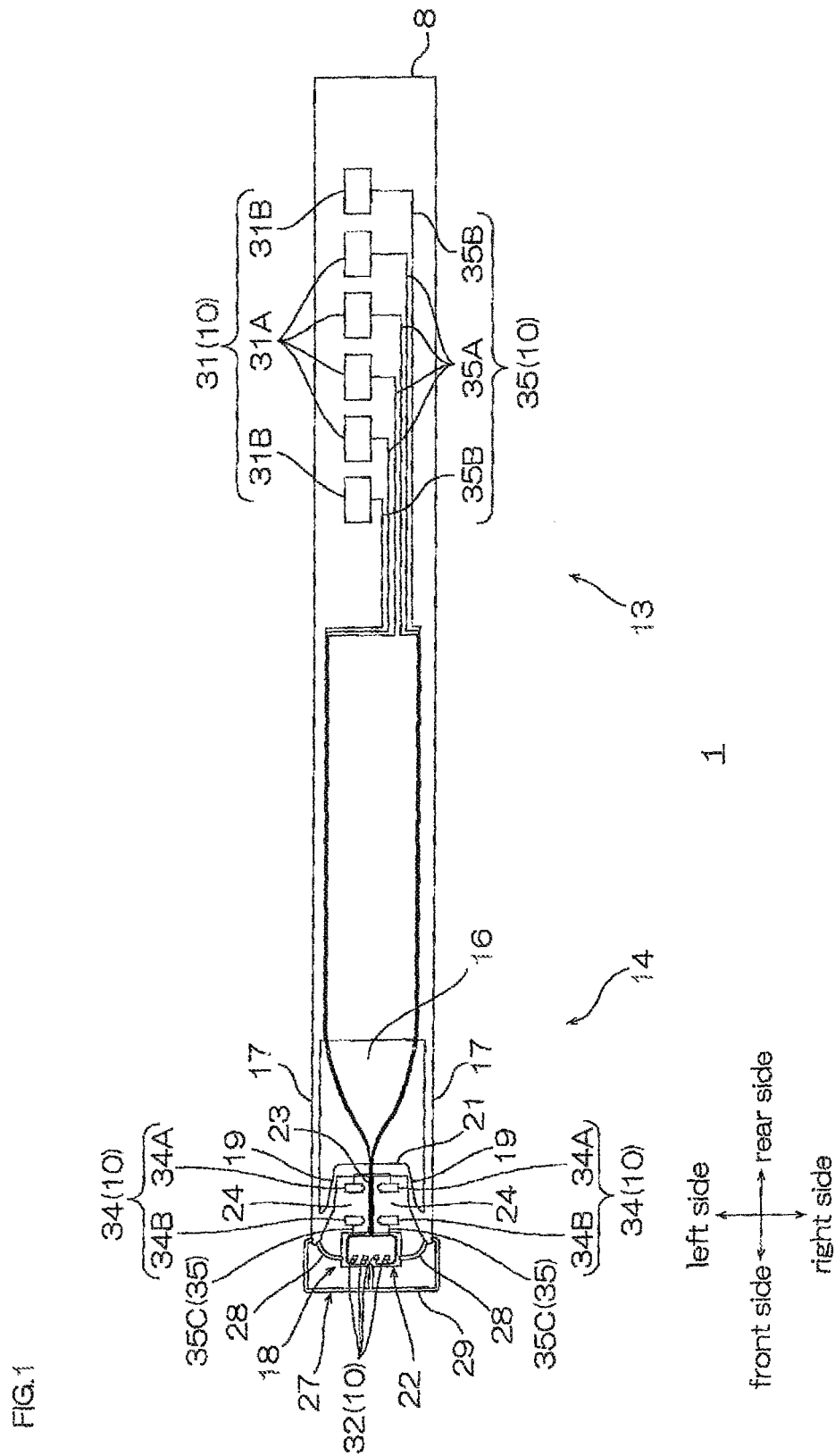
FIG. 1 shows a plan view for illustrating a first embodiment of a suspension board with circuit of the present invention.

In FIG. 1, the right-left direction of the paper surface is referred to as a front-rear direction (first direction); the left side of the paper surface is referred to as a front side (one side in the first direction); and the right side of the paper surface is referred to as a rear side (opposite side in the first direction). The up-down direction of the paper surface is referred to as a right-left direction (widthwise direction, second direction); the upper side of the paper surface is referred to as a left side (one side in the widthwise direction, one side in the second direction); and the lower side of the paper surface is referred to as a right side (opposite side in the widthwise direction, opposite side in the second direction). The paper thickness direction of the paper surface is referred to as an up-down direction (thickness direction, third direction); the near side of the paper surface is referred to as an upper side (one side in the thickness direction, one side in the third direction); and the far side of the paper surface is referred to as a lower side (opposite side in the thickness direction, opposite side in the third direction). To be specific, directions are in conformity with direction arrows in each view.

Figure 2:
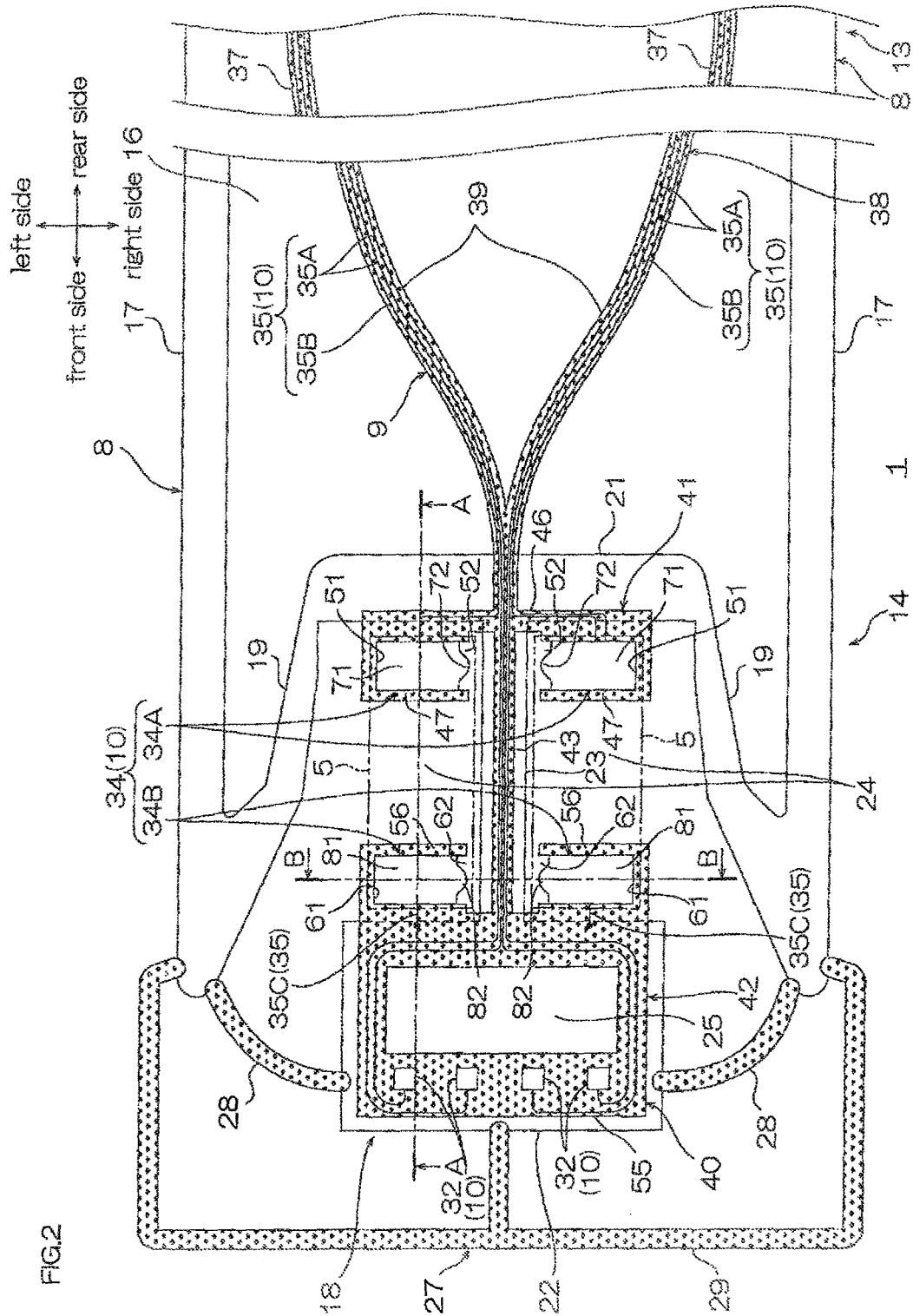
FIG. 2 shows a plan view of a gimbal portion of the suspension board with circuit shown in FIG. 1.

In FIG. 1, a base insulating layer 9 and a cover insulating layer 11 are omitted. In FIG. 2, the base insulating layer 9 is illustrated and the cover insulating layer 11 is omitted.

Figure 3:
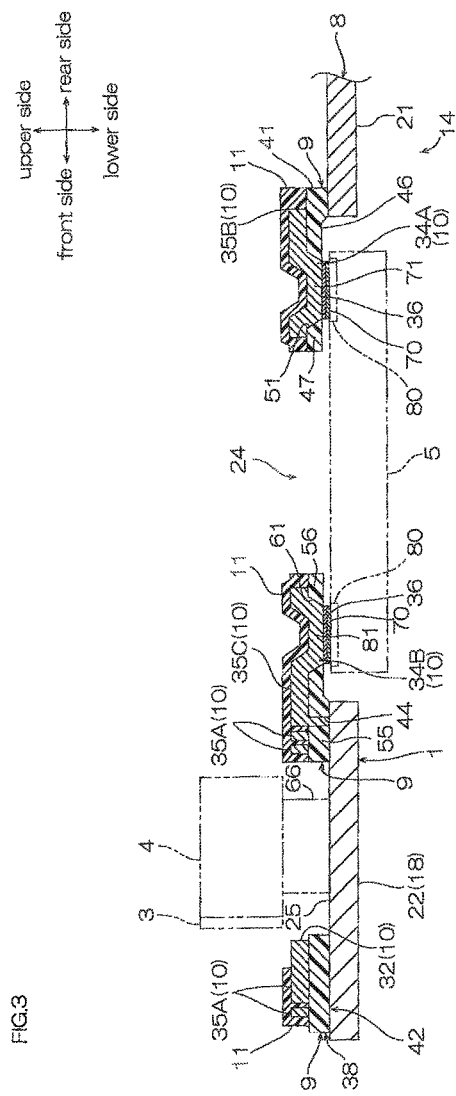
FIG. 3 shows a sectional view along an A-A line of the suspension board with circuit shown in FIG. 2.

As shown in FIG. 3, a suspension board with circuit 1 is mounted with a slider 4 mounted with a magnetic head 3 and, as one example of an electronic element, piezoelectric elements 5 to be mounted on a hard disk drive (not shown).

As shown in FIGS. 1 and 2, the suspension board with circuit 1 is formed into a flat belt shape extending in the front-rear direction. In the suspension board with circuit 1, a conductive layer 10 is supported by a metal supporting board 8.

The metal supporting board 8 is formed into a flat belt shape extending in the front-rear direction and integrally includes a main body portion 13 and a gimbal portion 14 that is formed at the front side of the main body portion 13.

The main body portion 13 is formed into a generally rectangular shape in plane view extending in the front-rear direction. When the suspension board with circuit 1 is mounted on a hard disk drive, the main body portion 13 is supported by load beam (not shown) of the hard disk drive.

The gimbal portion 14 is formed so as to extend from the front end of the main body portion 13 forwardly. A board opening portion 16 in a generally rectangular shape in plane view passing through the gimbal portion 14 in the up-down direction is formed in the gimbal portion 14.

The gimbal portion 14 includes a pair of outrigger portions 17 that is divided at the outer side in the right-left direction of the board opening portion 16 and a tongue portion 18 that is connected to the outrigger portions 17.

The pair of outrigger portions 17 is formed so as to extend in a linear shape from both end portions in the right-left direction of the main body portion 13 forwardly.

The tongue portion 18 is provided at the inner side in the right-left direction of the pair of outrigger portions 17. The tongue portion 18 is connected to each of the outrigger portions 17 via a pair of first connecting portions 19 that extends from each of the front end portions of the outrigger portions 17 toward obliquely inner rear side in the right-left direction.

The tongue portion 18 is formed into a generally H-shape in plane view having an opening toward both sides in the right-left direction. That is, in the tongue portion 18, both end portions in the right-left direction at the central portion in the front-rear direction thereof are cut out (have an opening).

To be specific, the tongue portion 18 integrally includes a base portion 21 in a generally rectangular shape in plane view that extends long in the right-left direction, a stage 22 in a generally rectangular shape in plane view that is disposed at the front side of the base portion 21 at spaced intervals thereto and extends long in the right-left direction, and a central portion 23 in a generally rectangular shape in plane view that connects the center of the base portion 21 to that of the stage 22 in the right-left direction and extends in the front-rear direction.

A pair of communication spaces 24, as one example of a support opening portion, is divided in a portion that is cut out in the tongue portion 18.

Each of the communication spaces 24 is divided by the base portion 21, the stage 22, and the central portion 23.

The pair of communication spaces 24 is divided at both sides in the right-left direction of the central portion 23. The pair of communication spaces 24 is formed so as to pass through the metal supporting board 8 in the up-down direction.

Both end portions in the right-left direction of the base portion 21 are connected to the inner-side end portion in the right-left direction of each of the first connecting portions 19.

As shown in FIG. 2, a mounting region 25 on which the slider 4 (ref: FIG. 3) is mounted is defined at the center in the right-left and front-rear directions of the stage 22.

As shown in FIGS. 1 and 2, the stage 22 is connected to each of the outrigger portions 17 via a second connecting portion 27 that has flexibility.

The second connecting portion 27 includes a pair of curved portions 28 that connects each of the front ends of the outrigger portions 17 to each of the both ends in the right-left direction of the stage 22 in a curved shape and an E-shaped portion 29 that connects each of the front ends of the outrigger portions 17 to the front end of the stage 22.

Each of the curved portions 28 extends in a curved shape from each of the front ends of the outrigger portions 17 toward obliquely inner front side in the right-left direction to then reach each of the both ends in the right-left direction of the stage 22.

The E-shaped portion 29 is formed into a generally E-shape in plane view. To be specific, the E-shaped portion 29 extends from each of the front ends of the outrigger portions 17 forwardly; then, bends toward the inner side in the right-left direction; extends toward the inner side in the right-left direction to be unified; and thereafter, bends rearwardly to reach the center in the right-left direction of the front end of the stage 22.

The central portion 23 is formed to have a narrow width capable of curving in the right-left direction.

The conductive layer 10 includes external side terminals 31, head-side terminals 32, piezoelectric terminals 34 as one example of a terminal portion, and wires 35 as one example of a wire portion.

As shown in FIG. 1, the external side terminals 31 are provided at the rear end portion of the main body portion 13 and a plurality (six pieces) thereof are disposed at spaced intervals to each other in the front-rear direction. The external side terminals 31 include signal terminals 31A and power supply terminals 31B.

Of the plurality (six pieces) of external side terminals 31, four pieces thereof at the center in the front-rear direction are the signal terminals 31A. The signal terminals 31A are electrically connected to a read/write board (not shown).

Of the plurality (six pieces) of external side terminals 31, one piece thereof at the front side and one piece thereof at the rear side are the power supply terminals 31B. The power supply terminals 31B are electrically connected to a power supply (not shown).

As shown in FIGS. 1 and 2, the head-side terminals 32 are provided at the front end portion of the stage 22 and a plurality (four pieces) thereof are disposed at spaced intervals to each other in the right-left direction.

A plurality (four pieces) of piezoelectric terminals 43 are disposed in the communication spaces 24. To be specific, the piezoelectric terminals 34 include a pair of rear-side piezoelectric terminals 34A that is disposed at spaced intervals to each other in the right-left direction by striding over the central portion 23 in the communication spaces 24 at the front side with respect to the front end edge of the base portion 21 and a pair of front-side piezoelectric terminals 34B that is disposed at the front side of the rear-side piezoelectric terminals 34A and is disposed at spaced intervals to each other in the right-left direction by striding over the central portion 23 in the communication spaces 24 at the rear side with respect to the rear end edge of the stage 22.

As shown in FIG. 1, in the main body portion 13, a plurality (six pieces) of wires 35 are formed at spaced intervals to each other in the right-left direction. The wires 35 include signal wires 35A and power supply wires 35B.

Of the plurality (six pieces) of wires 35, four pieces thereof at the inner side in the right-left direction are the signal wires 35A. The signal wires 35A are electrically connected to the signal terminals 31A and the head-side terminals 32. The signal wires 35A transmit an electrical signal between the magnetic head 3 (ref: FIG. 3) and the read/write board (not shown).

To be specific, the signal wires 35A are formed in the following manner. At the rear end portion of the main body portion 13, the signal wires 35A extend from the signal terminals 31A forwardly; bend in a branched state into two bundles toward both sides in the right-left direction at a midway portion in the front-rear direction of the main body portion 13; then, bend forwardly at both end portions in the right-left direction; and extend along the outer end edge in the right-left direction toward the front end portion of the main body portion 13. As shown in FIG. 2, in the gimbal portion 14, the signal wires 35A go through the board opening portion 16 to reach in a bundled state at the rear side of the base portion 21 and then, extend forwardly along the central portion 23 to thereafter again bend in a branched state into two bundles toward both sides in the right-left direction at the rear end portion of the stage 22. Next, the signal wires 35A extend forwardly along both end portions in the right-left direction of the stage 22 and are folded back at the front end portion of the stage 22 to finally reach the head-side terminals 32.

As shown in FIG. 1, of the plurality (six pieces) of wires 35, two pieces thereof at both outer sides in the front-rear direction with respect to the signal wires 35A are the power supply wires 35B. The power supply wires 35B are electrically connected to the power supply terminals 31B and the rear-side piezoelectric terminals 34A. The power supply wires 35B transmit an electrical signal between the piezoelectric elements 5 (ref: FIG. 3) and the power supply (not shown).

To be specific, the power supply wires 35B are formed in the following manner. At the rear end portion of the main body portion 13, the power supply wires 35B extend from the power supply terminals 31B forwardly along the signal wires 35A to the base portion 21. As shown in FIG. 2, in the base portion 21, the power supply wires 35B bend in a branched state toward both sides in the right-left direction and then, bend forwardly to reach the rear-side piezoelectric terminals 34A. The connection direction of the rear-side piezoelectric terminal 34A and the power supply wire 35B is along the front-rear direction.

In the gimbal portion 14, the wires 35 include a plurality (two pieces) of ground wires 35C formed at spaced intervals to each other in the right-left direction.

The ground wires 35C are provided so as to ground the front-side piezoelectric terminals 34B.

To be specific, the ground wires 35C extend from the front-side piezoelectric terminals 34B forwardly and bend downwardly (ref: FIG. 3) at the rear side of the signal wires 35A in the stage 22 to be then brought into contact with the metal supporting board 8. The connection direction of the front-side piezoelectric terminal 34B and the ground wire 35C is along the front-rear direction.

2. Layer Structure of Suspension Board with Circuit

Figure 4:
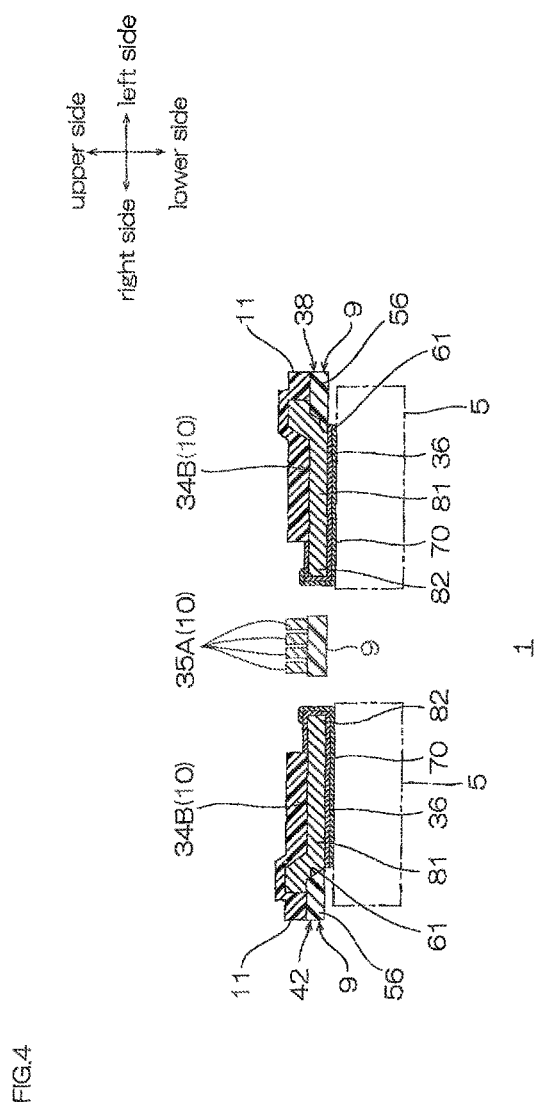
FIG. 4 shows a sectional view along a B-B line of the suspension board with circuit shown in FIG. 2.

As shown in FIGS. 3 and 4, the suspension board with circuit 1 includes the metal supporting board 8, the base insulating layer 9 that is formed on the metal supporting board 8, the conductive layer 10 that is formed on the base insulating layer 9, and the cover insulating layer 11 that is formed on the base insulating layer 9 so as to cover the conductive layer 10.

The metal supporting board 8 is formed into a shape corresponding to the outer shape (ref: FIG. 1) of the suspension board with circuit 1.

The metal supporting board 8 is formed of, for example, a metal material such as stainless steel, 42-alloy, aluminum, copper-beryllium, and phosphor bronze. Preferably, the metal supporting board 8 is formed of stainless steel.

The metal supporting board 8 has a thickness of, for example, 10 μm or more, or preferably 12 μm or more, and, for example, 35 μm or less, or preferably 30 μm or less.

The base insulating layer 9 is formed over the main body portion 13 and the gimbal portion 14 (ref: FIG. 1) in the metal supporting board 8. To be specific, the base insulating layer 9 is formed into a pattern corresponding to the above-described conductive layer 10. The base insulating layer 9 is also formed into a pattern forming the second connecting portion 27 (ref: FIG. 2).

The base insulating layer 9 is formed of, for example, an insulating material such as a synthetic resin. Examples thereof include polyimide resin, polyamideimide resin, acrylic resin, polyether nitrile resin, polyether sulfone resin, polyethylene terephthalate resin, polyethylene naphthalate resin, and polyvinyl chloride resin. Preferably, the base insulating layer 9 is formed of a polyimide resin.

The base insulating layer 9 has a thickness (maximum thickness) of, for example, 1 μm or more, or preferably 3 μm or more, and, for example, 35 μm or less, or preferably 33 μm or less.

As described above, the conductive layer 10 is formed as a pattern including the external side terminals 31 (ref: FIG. 1), the head-side terminals 32 (ref: FIG. 1), the piezoelectric terminals 34, and the wires 35.

The conductive layer 10 is formed of, for example, a conductive material such as copper, nickel, gold, and solder or an alloy thereof. Preferably, the conductive layer 10 is formed of copper.

The conductive layer 10 has a thickness of, for example, 3 μm or more, or preferably 5 μm or more, and, for example, 50 μm or less, or preferably 20 μm or less.

The wire 35 has a width of, for example, 5 μm or more, or preferably 8 μm or more, and, for example, 200 μm or less, or preferably 100 μm or less.

An interval between the plurality of wires 35 is, for example, 5 μm or more, or preferably 8 μm or more, and, for example, 1000 μm or less, or preferably 100 μm or less.

The external side terminal 31 and the head-side terminal 32 have a width and a length (length in the front-rear direction) of, for example, 20 μm or more, or preferably 30 μm or more, and, for example, 1000 μm or less, or preferably 800 μm or less.

An interval between the plurality of external side terminals 31 and that between the plurality of head-side terminals 32 are, for example, 20 μm or more, or preferably 30 μm or more, and, for example, 1000 μm or less, or preferably 800 μm or less.

The cover insulating layer 11 is formed over the main body portion 13 and the gimbal portion 14 (ref: FIG. 1). The cover insulating layer 11 is formed on the base insulating layer 9 into a pattern including the conductive layer 10 in plane view.

To be specific, the cover insulating layer 11 is formed into a pattern covering the upper surfaces of the wires 35 and the piezoelectric terminals 34 and exposing the upper surfaces of the external side terminals 31 and the head-side terminals 32 (ref: FIG. 1). A part of the upper surfaces of the piezoelectric terminals 34 is, as described later, exposed from the cover insulating layer 11.

The cover insulating layer 11 is formed of the same insulating material as that of the base insulating layer 9. The cover insulating layer 11 has a thickness of, for example, 1 μm or more, or preferably 3 μm or more, and, for example, 40 μm or less, or preferably 10 μm or less.

The plating layer 36 is formed on the surfaces of a plurality of terminals, to be specific, the external side terminals 31, the head-side terminals 32, and the piezoelectric terminals 34. The plating layer 36 is formed by, for example, electroless plating, electrolytic plating, or the like. The plating layer 36 is formed of, for example, a metal material such as nickel and gold. Preferably, the plating layer 36 is formed of gold. The plating layer 36 has a thickness of, for example, 0.01 μm or more, or preferably 0.05 μm or more, and, for example, 5 μm or less, or preferably 4.5 μm or less.

3. Details of Base Insulating Layer, Piezoelectric Terminal, and Cover Insulating Layer (1) Details of Base Insulating Layer As shown in FIG. 2, the base insulating layer 9 is formed on the upper surface of the metal supporting board 8 into a pattern corresponding to the above-described conductive layer 10. To be specific, the base insulating layer 9 includes a main body portion-insulating layer 37 corresponding to the main body portion 13 and a gimbal portion-insulating layer 38 corresponding to the gimbal portion 14.

The main body portion-insulating layer 37 is, in the main body portion 13, formed so as to correspond to the external side terminals 31 (ref: FIG. 1) and the wires 35.

The gimbal portion-insulating layer 38 includes a board opening portion-insulating layer 39 corresponding to the board opening portion 16 and a tongue portion-insulating layer 40 corresponding to the tongue portion 18.

The board opening portion-insulating layer 39 is formed corresponding to the conductive layer 10 in the board opening portion 16. To be specific, the board opening portion-insulating layer 39 is formed into a generally Y-shape in plane view that branches off toward both sides in the right-left direction at the rear side, corresponding to the wires 35 going through the board opening portion 16, to be unified at the rear side with respect to the base portion 21 and extends to a midway portion in the front-rear direction of the base portion 21.

The tongue portion-insulating layer 40 is formed into a generally H-shape in plane view corresponding to the tongue portion 18. The tongue portion-insulating layer 40 integrally includes a base portion-insulating layer 41 in a generally rectangular shape in plane view that is continuous to the board opening portion-insulating layer 39 and extends long in the right-left direction; a stage insulating layer 42 in a generally rectangular shape in plane view that is disposed at the front side of the base portion-insulating layer 41 at spaced intervals thereto and extends long in the right-left direction; and a central portion-insulating layer 43 in a generally rectangular shape in plane view that connects the center of the base portion-insulating layer 41 to that of the stage insulating layer 42 in the right-left direction and is long in the front-rear direction.

The base portion-insulating layer 41 is formed corresponding to the conductive layer 10 in the base portion 21 in the tongue portion 18. The base portion-insulating layer 41 is, at the front side of the base portion 21 in the tongue portion 18, continuous from the board opening portion-insulating layer 39 and extends toward both outer sides in the right-left direction. The base portion-insulating layer 41 is formed so as to extend forwardly with respect to the front end edge of the base portion 21. The base portion-insulating layer 41 includes a rear-side base portion-insulating layer 46 and a pair of front-side base portion-insulating layers 47.

The rear-side base portion-insulating layer 46 forms the rear-side portion of the base portion-insulating layer 41 and is formed into a generally rectangular shape in plane view. The rear-side base portion-insulating layer 46 is continuous from the board opening portion-insulating layer 39 and extends toward both outer sides in the right-left direction with respect to the central portion-insulating layer 43. The rear end portion of the rear-side base portion-insulating layer 46 is formed on the base portion 21. The central portion and the front end portion in the front-rear direction of the rear-side base portion-insulating layer 46 protrude forwardly with respect to the base portion 21.

Each of the front-side base portion-insulating layers 47 forms the front-side portion of the base portion-insulating layer 41 and is formed into a generally rectangular shape in plane view. The pair of front-side base portion-insulating layers 47 is continuous from the left-side portion and the right-side portion, excluding the central portion, of the rear-side base portion-insulating layer 46 and extends forwardly. The pair of front-side base portion-insulating layers 47 strides over the central portion-insulating layer 43 to be described later and is disposed at spaced intervals to each other in the right-left direction. A base portion-opening portion 51 and a base portion-cutout portion 52 are formed in each of the front-side base portion-insulating layers 47.

In this manner, each of the front-side base portion-insulating layers 47 is formed into a generally U-shape in plane view with the inner side in the right-left direction thereof open.

The base portion-opening portion 51 is formed into a rectangular shape in plane view that is slightly smaller than each of the outer edges of the front-side base portion-insulating layers 47. The base portion-opening portion 51 is disposed in almost the entire region of each of the front-side base portion-insulating layers 47 so that each of the front end portions, each of the rear end portions, and each of the outer-side end portions in the right-left direction of the pair of front-side base portion-insulating layers 47 remain and so that the inner-side end portion in the right-left direction thereof is opened by the base portion-cutout portion 52 to be described later. The base portion-opening portion 51 passes through each of the front-side base portion-insulating layers 47 along the up-down direction. As shown in FIG. 3, the base portion-opening portion 51 is, when projected in the up-down direction, housed in the pair of communication spaces 24.

In this manner, the upper and lower surfaces of the piezoelectric terminals 34 are exposed from the rear-side base portion-insulating layers 46.

As shown in FIG. 2, in each of the front-side base portion-insulating layers 47, the base portion-cutout portion 52 is disposed at the inner-side portion in the right-left direction. The base portion-cutout portion 52 is formed by cutting out each of the inner-side portions in the right-left direction of the pair of front-side base portion-insulating layers 47 in the right-left direction and is communicated with the base portion-opening portion 51. That is, the base portion-cutout portion 52 is formed to be continuous from the base portion-opening portion 51.

In this manner, the inner-side end surfaces in the right-left direction of the piezoelectric terminals 34 are exposed from the rear-side base portion-insulating layers 46.

The base portion-opening portion 51 and the base portion-cutout portion 52 have a length in the front-rear direction of, for example, 20 μm or more, or preferably 30 μm or more, and, for example, 500 μm or less, or preferably 400 μm or less.

The total width of the base portion-opening portion 51 and the base portion-cutout portion 52 is, for example, 20 μm or more, or preferably 30 μm or more, and, for example, 500 μm or less, or preferably 400 μm or less.

The stage insulating layer 42 is formed corresponding to the conductive layer 10 in the stage 22 of the tongue portion 18. The stage insulating layer 42 is formed so as to extend from the front side of the stage 22 in the tongue portion 18 rearwardly with respect to the rear end edge of the stage 22. The stage insulating layer 42 includes a front-side stage insulating layer 55 and a pair of rear-side stage insulating layers 56.

The front-side stage insulating layer 55 forms the front-side portion of the stage insulating layer 42 and is formed into a generally rectangular shape in plane view. The front-side stage insulating layer 55 extends, corresponding to the stage 22 of the tongue portion 18, from the central portion thereof toward both outer sides in the right-left direction.

Each of the rear-side stage insulating layers 56 forms the rear-side portion of the stage insulating layer 42 and is formed into a generally rectangular shape in plane view. The pair of rear-side stage insulating layers 56 is continuous from the left-side portion and the right-side portion, excluding the central portion, of the front-side stage insulating layer 55 and extends rearwardly. The pair of rear-side stage insulating layers 56 strides over the central portion-insulating layer 43 to be described later and is disposed at spaced intervals to each other in the right-left direction. A stage opening portion 61 and a stage cutout portion 62 are formed in each of the rear-side stage insulating layers 56.

In this manner, each of the rear-side stage insulating layers 56 is formed into a generally U-shape in plane view with the inner side in the right-left direction thereof open.

The stage opening portion 61 is formed into a rectangular shape in plane view that is slightly smaller than each of the outer edges of the rear-side stage insulating layers 56. The stage opening portion 61 is disposed in almost the entire region of each of the rear-side stage insulating layers 56 so that each of the front end portions, each of the rear end portions, and each of the outer-side end portions in the right-left direction of the rear-side stage insulating layers 56 remain and so that the inner-side end portion in the right-left direction thereof is opened by the stage cutout portion 62 to be described later. The stage opening portion 61 passes through each of the rear-side stage insulating layers 56 along the up-down direction. As shown in FIG. 3, the stage opening portion 61 is, when projected in the up-down direction, housed in the pair of communication spaces 24.

In this manner, the upper and lower surfaces of the piezoelectric terminals 34 are exposed from the rear-side stage insulating layers 56.

As shown in FIG. 2, in each of the rear-side stage insulating layers 56, the stage cutout portion 62 is disposed at the inner-side portion in the right-left direction. The stage cutout portion 62 is formed by cutting out each of the inner-side portions in the right-left direction of the rear-side stage insulating layers 56 along the right-left direction and is communicated with the stage opening portion 61. That is, the stage cutout portion 62 is formed to be continuous from the stage opening portion 61.

In this manner, the inner-side end surfaces in the right-left direction of the piezoelectric terminals 34 are exposed from the rear-side stage insulating layers 56.

The stage opening portion 61 and the stage cutout portion 62 have a length in the front-rear direction of, for example, 10 μm or more, or preferably 20 μm or more, and, for example, 500 μm or less, or preferably 400 μm or less.

The total width of the stage opening portion 61 and the stage cutout portion 62 is, for example, 10 μm or more, or preferably 20 μm or more, and, for example, 500 μm or less, or preferably 400 μm or less.

The base portion-opening portion 51 and the stage opening portion 61 configure one example of an insulating opening portion. The base portion-cutout portion 52 and the stage cutout portion 62 configure one example of a cutout portion.

Furthermore, as shown in FIG. 3, a plurality (two pieces) of grounding opening portions 44 are formed in the stage insulating layer 42.

The grounding opening portions 44 are, when projected in the up-down direction, formed in an overlapped portion with the rear end portion of the stage 22 so as to pass through the stage insulating layer 42 in the up-down direction.

The grounding opening portion 44 has a width and a length (length in the front-rear direction) of, for example, 5 μm or more, or preferably 10 μm or more, and, for example, 100 μm or less, or preferably 90 μm or less.

As shown in FIG. 2, the central portion-insulating layer 43 is formed corresponding to the conductive layer 10 in the central portion 23 of the tongue portion 18. The central portion-insulating layer 43 is formed into a generally rectangular shape in plane view having a narrower width than that of the central portion 23 of the tongue portion 18. The central portion-insulating layer 43 is continuous to the central portion in the right-left direction of the rear-side base portion-insulating layer 46 in the base portion-insulating layer 41 and to the central portion in the right-left direction of the front-side stage insulating layer 55 in the stage insulating layer 42.

(2) Details of Piezoelectric Terminal

As described above, the piezoelectric terminals 34 include the pair of rear-side piezoelectric terminals 34A and the pair of front-side piezoelectric terminals 34B.

Each of the rear-side piezoelectric terminals 34A fills the base portion-opening portion 51 in each of the front-side base portion-insulating layers 47. Each of the rear-side piezoelectric terminals 34A includes a first rear-side piezoelectric terminal portion 71 and a second rear-side piezoelectric terminal portion 72.

Each of the first rear-side piezoelectric terminal portions 71 is formed into a generally rectangular shape in plane view and is disposed at the inside of the base portion-opening portion 51 so as to expose the lower surface thereof from each of the base portion-opening portions 51 in the pair of front-side base portion-insulating layers 47. The upper surface thereof is, as described later, covered with the cover insulating layer 11.

Each of the second rear-side piezoelectric terminal portions 72 is disposed at the inner side in the right-left direction with respect to the corresponding first rear-side piezoelectric terminal portion 71 to be continuous thereto. The second rear-side piezoelectric terminal portion 72 protrudes from the first rear-side piezoelectric terminal portion 71 toward the base portion-cutout portion 52. That is, the second rear-side piezoelectric terminal portion 72 is a free end portion of the inner side in the right-left direction of the rear-side piezoelectric terminal 34A. To be more specific, the second rear-side piezoelectric terminal portion 72 expands in a generally circular arc shape in plane view from the central portion in the front-rear direction toward the inner side in the right-left direction at the inner-side end edge in the right-left direction of the first rear-side piezoelectric terminal portion 71.

In the second rear-side piezoelectric terminal portion 72, the upper, lower, and side surfaces thereof are exposed by the base portion-cutout portion 52, in other words, the upper, lower, and side surfaces thereof are opened from the front-side base portion-insulating layer 47 by the base portion-cutout portion 52.

Each of the front-side piezoelectric terminals 34B fills the stage opening portion 61 in each of the rear-side stage insulating layers 56. Each of the front-side piezoelectric terminals 34B includes a first front-side piezoelectric terminal portion 81 and a second front-side piezoelectric terminal portion 82.

Each of the first front-side piezoelectric terminal portions 81 is formed into a generally rectangular shape in plane view and is disposed at the inside of the stage opening portion 61 so as to expose the lower surface thereof from each of the stage opening portions 61 in the pair of rear-side stage insulating layers 56. The upper surface thereof is, as described later, covered with the cover insulating layer 11.

Each of the second front-side piezoelectric terminal portions 82 is disposed at the inner side in the right-left direction with respect to the corresponding first front-side piezoelectric terminal portion 81 to be continuous thereto. The second front-side piezoelectric terminal portion 82 protrudes from the first front-side piezoelectric terminal portion 81 toward the stage cutout portion 62. That is, the second front-side piezoelectric terminal portion 82 is a free end portion of the inner side in the right-left direction of the front-side piezoelectric terminal 34B. To be more specific, the second front-side piezoelectric terminal portion 82 expands in a generally circular arc shape in plane view from the central portion in the front-rear direction toward the inner side in the right-left direction at the inner-side end edge in the right-left direction of the first front-side piezoelectric terminal portion 81.

In the second front-side piezoelectric terminal portion 82, the upper, lower, and side surfaces thereof are exposed by the stage cutout portion 62, in other words, the upper, lower, and side surfaces thereof are opened from the rear-side stage insulating layer 56 by the stage cutout portion 62.

The second rear-side piezoelectric terminal portion 72 and the second front-side piezoelectric terminal portion 82 configure one example of a terminal free end portion and a protruding portion.

As shown in FIG. 3, each of the piezoelectric terminals 34 is, when projected in the right-left direction, formed into an inverted hat shape in which both end portions in the front-rear direction thereof ride over the upper surface of the base insulating layer 9 and the central portion in the front-rear direction thereof sinks. Also, as shown in FIG. 4, the piezoelectric terminal 34 is, when projected in the front-rear direction, formed into a generally Z-shape in which one end portion until a midway portion in the right-left direction thereof is flat and the opposite end portion in the right-left direction thereof rides over the upper surface of the base insulating layer 9. To be more specific, in the piezoelectric terminal 34, the first rear-side piezoelectric terminal portion 71 and the first front-side piezoelectric terminal portion 81 are, when projected in the front-rear direction, formed into a linear shape.

The lower surface of the piezoelectric terminal 34 is, in the right-left direction and the front-rear direction, that is, in a plane direction, formed to be flush with the lower surface of the base insulating layer 9 formed in the circumferential end portion thereof.

The piezoelectric terminal 34 has a length in the front-rear direction of, for example, 10 μm or more, or preferably 20 μm or more, and, for example, 500 μm or less, or preferably 400 μm or less.

The piezoelectric terminal 34 has a width of, for example, 10 μm or more, or preferably 20 μm or more, and, for example, 500 μm or less, or preferably 400 μm or less.

(3) Details of Cover Insulating Layer

The upper surface of the piezoelectric terminal 34, excluding a portion thereof, is covered with the cover insulating layer 11. To be specific, the upper surfaces of the first rear-side piezoelectric terminal portion 71 and the first front-side piezoelectric terminal portion 81 in the piezoelectric terminal 34 are covered with the cover insulating layer 11. The upper surfaces of the second rear-side piezoelectric terminal portion 72 and the second front-side piezoelectric terminal portion 82 in the piezoelectric terminal 34 are exposed without being covered with the cover insulating layer 11.

That is, the end edges of the second rear-side piezoelectric terminal portion 72 and the second front-side piezoelectric terminal portion 82 in the piezoelectric terminal 34 are, when projected in the up-down direction, disposed at the inner side in the right-left direction with respect to the end edge of the cover insulating layer 11 in the right-left direction.

A length from the end edge of the second rear-side piezoelectric terminal portion 72 in the piezoelectric terminal 34 to that of the cover insulating layer 11 and a length from the end edge of the second front-side piezoelectric terminal portion 82 in the piezoelectric terminal 34 to that of the cover insulating layer 11 in the right-left direction are, for example, 1 μm or more, or preferably 5 μm or more, and, for example, 250 μm or less, or preferably 200 μm or less.

The ratio of the length from the end edge of the second rear-side piezoelectric terminal portion 72 in the piezoelectric terminal 34 to that of the cover insulating layer 11 and the length from the end edge of the second front-side piezoelectric terminal portion 82 in the piezoelectric terminal 34 to that of the cover insulating layer 11 to the length of the piezoelectric terminal 34 in the right-left direction is, for example, 1% or more, or preferably 5% or more, and, for example, 50% or less, or preferably 40% or less.

4. Method for Producing Suspension Board with Circuit

Next, a method for producing the suspension board with circuit 1 is described with reference to FIGS. 5A to 6G. In FIGS. 5A to 6G, sectional views along the A-A line of the suspension board with circuit 1 are illustrated at the left side of the paper surface and sectional views along the B-B line of the suspension board with circuit 1 are illustrated at the right side of the paper surface.

In this method, as shown in FIG. 5A, the metal supporting board 8 is first prepared.

Next, as shown in FIG. 5B, the base insulating layer 9 is formed on the metal supporting board 8.

To be specific, the base insulating layer 9 is formed on the metal supporting board 8 as a pattern corresponding to the main body portion-insulating layer 37 and the gimbal portion-insulating layer 38. As a pattern corresponding to the gimbal portion-insulating layer 38, the base insulating layer 9 is formed so as to include a concave portion 65 in each of the front-side base portion-insulating layers 47 and each of the rear-side stage insulating layers 56. The base insulating layer 9 is also formed so as to include the grounding opening portion 44 in the stage insulating layer 42.

Each of the concave portions 65 is formed so as to sink from the upper surface of the base insulating layer 9 downwardly. To be more specific, in the front-rear direction, the concave portion 65 inclines downwardly from the upper surface of the base insulating layer 9 toward the front side; then, extends forwardly; and thereafter, inclines upwardly toward the front side to be continuous to the upper surface of the base insulating layer 9. Also, in the right-left direction, the concave portion 65 inclines downwardly from the upper surface of the base insulating layer 9 toward the inner side in the right-left direction to then extend forwardly in a flat state. That is, the concave portion 65 sinks in a generally U-shape in the front-rear direction and sinks in a generally L-shape in the front-rear direction.

The ratio of a depth (height in the up-down direction) of the concave portion 65 from the upper surface of the base insulating layer 9 to a thickness of the base insulating layer 9 is, for example, 5% or more, or preferably 10% or more, and, for example, 95% or less, or preferably 90% or less. To be specific, the depth (height in the up-down direction) of the concave portion 65 from the upper surface of the base insulating layer 9 is, for example, 0.1 μm or more, or preferably 0.5 μm or more, and, for example, 32μm or less, or preferably 30 μm or less.

A length in the front-rear direction of the concave portion 65 is the same as that in the front-rear direction of the base portion-opening portion 51, the base portion-cutout portion 52, the stage opening portion 61, and the stage cutout portion 62. A width of the concave portion 65 is the same as the total width of the base portion-opening portion 51 and the base portion-cutout portion 52 or the total width of the stage opening portion 61 and the stage cutout portion 62.

To form the base insulating layer 9 in which the concave portion 65 and the grounding opening portion 44 are formed, a varnish of a photosensitive insulating material is applied onto the metal supporting board 8 to be then dried, so that a base film is foamed.

Thereafter, the base film is exposed to light via a gradation exposure photomask that is not shown (gradation exposure to light). The gradation exposure photomask includes a light shielding portion, a light semi-transmitting portion, and a light full transmitting portion in a pattern. The light full transmitting portion to a portion in which the base insulating layer 9 (excluding a portion in which the concave portion 65 and the grounding opening portion 44 are formed) is formed; the light semi-transmitting portion to a portion in which the concave portion 65 is formed; and the light shielding portion to a portion in which the base insulating layer 9 is not formed and the grounding opening portion 44 is formed are respectively disposed in opposed relation to the base film.

Thereafter, the base film is developed and, if necessary, is allowed to cure by heating, so that the base insulating layer 9 including the concave portion 65 and the grounding opening portion 44 is formed in the above-described pattern.

Next, as shown in FIG. 5C, the conductive layer 10 is formed on the upper surface of the base insulating layer 9 by a pattern forming method such as an additive method or a subtractive method, or preferably by an additive method.

That is, as referred to FIG. 1, the conductive layer 10 is formed on the upper surface of the base insulating layer 9 so as to include the external side terminals 31, the head-side terminals 32, the piezoelectric terminals 34, and the wires 35. The piezoelectric terminal 34 fills so as to be fallen into the inside of the concave portion 65 and the end portion at the opposite side to the front-side piezoelectric terminal 34B in the ground wire 35C fills so as to be fallen into the inside of the grounding opening portion 44.

Next, as shown in FIG. 5D, the cover insulating layer 11 is formed on the upper surface of the base insulating layer 9. To form the cover insulating layer 11, a varnish of a photosensitive insulating material is applied to be then dried, so that a cover film is formed. Thereafter, the obtained cover film is exposed to light and subsequently, is developed to be allowed to cure by heating, so that the cover insulating layer 11 is formed in the above-described pattern. The cover insulating layer 11 is formed so as to cover the first rear-side piezoelectric terminal portions 71 and the first front-side piezoelectric terminal portions 81, excluding a portion near the inner-side end edges in the right-left direction thereof, and to expose the second rear-side piezoelectric terminal portions 72 and the second front-side piezoelectric terminal portions 82 in the piezoelectric terminals 34. In this manner, the end edge of the cover insulating layer 11 is brought into tight contact with a portion near the inner-side end edges in the right-left direction of the first rear-side piezoelectric terminal portions 71 and the first front-side piezoelectric terminal portions 81 in the piezoelectric terminals 34.

Next, as shown in FIG. 6E, the metal supporting board 8 is trimmed by, for example, etching or the like so that the board opening portion 16 (ref: FIG. 1) and the communication spaces 24 are formed and the lower surfaces of the front-side base portion-insulating layers 47 in the base portion-insulating layer 41 and the lower surfaces of the rear-side stage insulating layers 56 in the stage insulating layer 42 are exposed.

Next, as shown in FIG. 6F, in the base insulating layer 9, the bottom walls of the concave portions 65, that is, the front-side base portion-insulating layers 47 in the base portion-insulating layer 41 and the rear-side stage insulating layers 56 in the stage insulating layer 42 are partially removed, to be specific, by etching, or preferably by wet etching or the like.

In this manner, the lower surfaces of the piezoelectric terminals 34 are exposed. In the front-side base portion-insulating layers 47 in the base portion-insulating layer 41 and the rear-side stage-insulating layers 56 in the stage insulating layer 42, the lower surfaces of the concave portions 65 pass therethrough, so that the base portion-opening portions 51 (ref: FIG. 1), the base portion-cutout portions 52 (ref: FIG. 1), the stage opening portions 61, and the stage cutout portions 62 (ref: FIG. 1) are formed.

Next, as shown in FIG. 6C; the plating layer 36 is formed with respect to the piezoelectric terminals 34 that are exposed from the base portion-opening portions 51 (ref: FIG. 1), the base portion-cutout portions 52 (ref: FIG. 1), the stage opening portions 61, and the stage cutout portions 62 (ref: FIG. 1).

In this manner, the suspension board with circuit 1 is obtained. The suspension board with circuit 1 is thereafter shipped and is stored until the slider 4 and the piezoelectric elements 5 are to be mounted thereon.

To mount the suspension board with circuit 1 on a hard disk drive, as shown in FIG. 3, the suspension board with circuit 1 is mounted with the slider 4 and the piezoelectric elements 5.

The slider 4 is mounted on the mounting region 25 via an adhesive layer 66. A terminal that is not shown of the slider 4 is connected to the head-side terminal 32 via solder or the like.

The piezoelectric element 5 is an actuator that is capable of stretching and shrinking in the front-rear direction and is formed into a generally rectangular shape in plane view extending in the front-rear direction. The piezoelectric element 5 is configured to stretch and shrink by allowing electricity to supply thereto and its voltage to be controlled.

A pair of piezoelectric elements 5 is disposed at spaced intervals to each other in the right-left direction so as to sandwich the central portion 23 therebetween. A. terminal 80 of each of the piezoelectric elements 5 is fixed to the rear-side piezoelectric terminal 34A and the front-side piezoelectric terminal 34B via a conductive connection member 70 to be electrically connected thereto. The conductive connection member 70 is made of an electrically conductive adhesive or solder. The conductive connection members 70 adhere to the lower and side surfaces of the rear-side piezoelectric terminals 34A and the front-side piezoelectric terminals 34B and also adheres to the upper surfaces of the piezoelectric elements 5.

5. Swinging Movement of Suspension Board with Circuit

Figure 7:
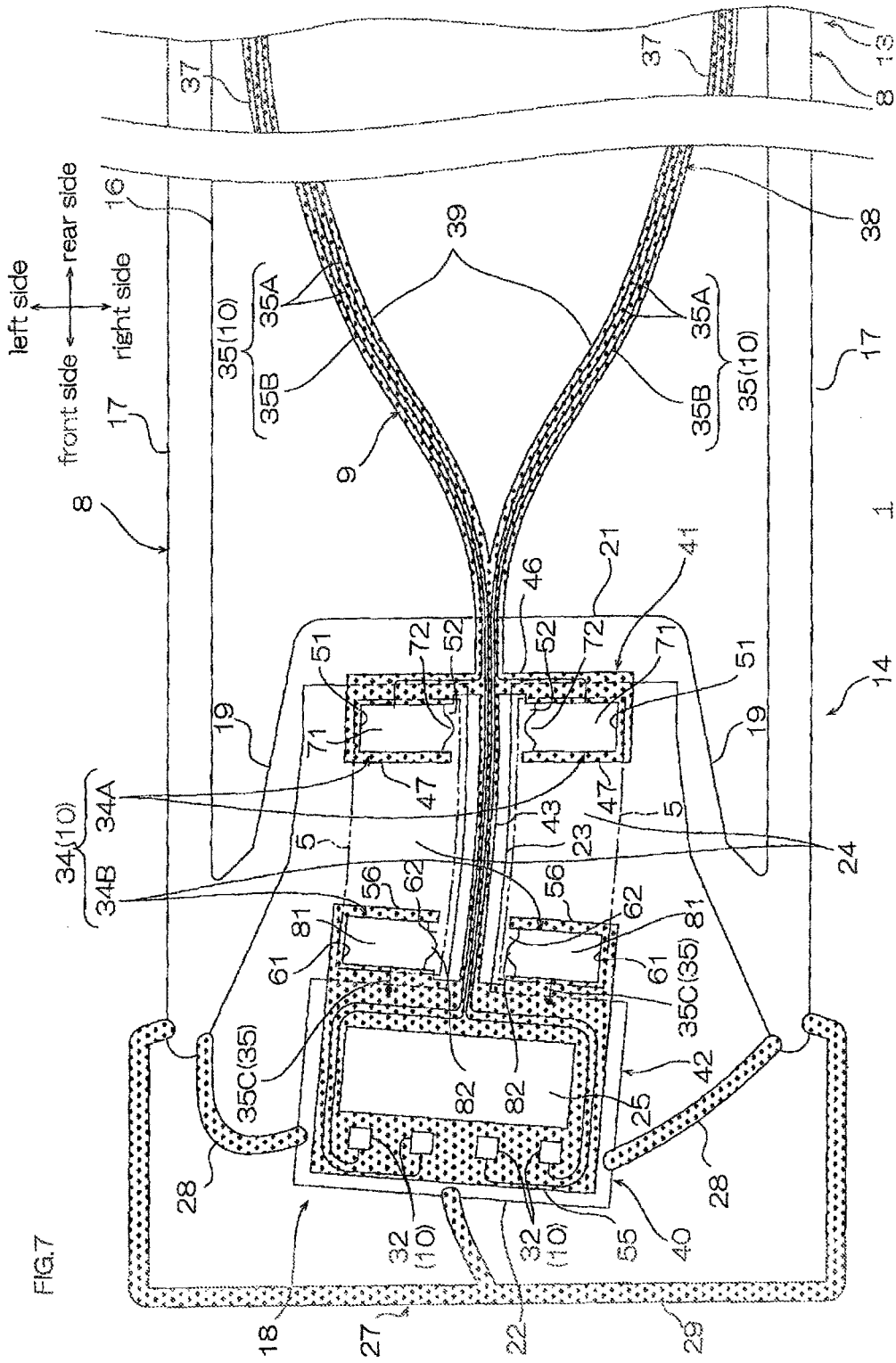
FIG. 7 shows a plan view for illustrating a state in which the suspension board with circuit shown in FIG. 2 swings.

Next, the swinging of the slider 4 (the suspension board with circuit 1) by stretching and shrinking of the piezoelectric elements 5 is described with reference to FIG. 7.

First, in a state where the front-side piezoelectric terminals 34B are grounded to the metal supporting board 8, electricity is supplied via the rear-side piezoelectric terminals 34A and its voltage is controlled, so that one piezoelectric element 5 shrinks. Then, one rear-side piezoelectric terminal 34A and one front-side piezoelectric terminal 34B that fix the one piezoelectric element 5 are relatively brought into closer to each other. That is, the one front-side piezoelectric terminal 34B that is supported by the stage insulating layer 42 moves rearwardly with respect to the one rear-side piezoelectric terminal 34A that is supported by the base portion-insulating layer 41.

At the same time with this, electricity is supplied to the other piezoelectric element 5 via the piezoelectric terminals 34 and its voltage is controlled, so that the other piezoelectric element 5 stretches. Then, the other rear-side piezoelectric terminal 34A and the other front-side piezoelectric terminal 34B that fix the other piezoelectric element 5 are relatively separated from each other. That is, the other front-side piezoelectric terminal 34B that is supported by the stage insulating layer 42 moves forwardly with respect to the other rear-side piezoelectric terminal 34A that is supported by the base portion-insulating layer 41.

In this manner, while the front end and a midway portion in the front-rear direction of the central portion 23 curve to one side in the right-left direction (left side in FIG. 7), the stage 22 swings toward the one side in the right-left direction with the rear end of the central portion 23 as a supporting point. Along with this, the slider 4 (the front-side portion of the suspension board with circuit 1) swings toward the one side in the right-left direction.

When the one piezoelectric element 5 stretches and the other piezoelectric element 5 shrinks, the slider 4 (the front-side portion of the suspension board with circuit 1) swings in the opposite direction (the other side in the widthwise direction, the right side in FIG. 8) to the description above.

In this manner, each of the piezoelectric elements 5 stretches and shrinks, so that the position and the angle of the magnetic head 3 are minutely adjusted. At this time, by stretching and shrinking of each of the piezoelectric elements 5, the piezoelectric terminal 34, which is connected to the element, is slightly displaced.

6. Function and Effect

According to the suspension board with circuit 1, as shown in FIG. 2, the base portion-cutout portions 52 are formed by cutting out the inner-side end portion in the right-left direction of the base portion-insulating layer 41 along the right-left direction so as to be communicated with the base portion-opening portions 51. The stage cutout portions 62 are formed by cutting out the inner-side end portion in the right-left direction of the stage insulating layer 42 along the right-left direction so as to be communicated with the stage opening portions 61. The second rear-side piezoelectric terminal portions 72 are opened from the base portion-insulating layers 41 by the base portion-cutout portions 52. The second front-side piezoelectric terminal portions 82 are opened from the stage insulating layer 42 by the stage cutout portions 62.

Thus, the bonded area of the piezoelectric elements 5 with the piezoelectric terminals 34 can be increased by the second rear-side piezoelectric terminal portions 72 and the second front-side piezoelectric terminal portions 82.

As a result, the connection reliability of the piezoelectric elements 5 with the piezoelectric terminals 34 can be improved.

According to the suspension board with circuit 1, as shown in FIG. 2, the piezoelectric terminals 34 are displaced by stretching and shrinking of the piezoelectric elements 5.

Even when swinging of the suspension board with circuit 1 by stretching and shrinking of the piezoelectric elements 5 causes distortion between the piezoelectric elements 5 and the piezoelectric terminals 34, the connection reliability of the piezoelectric elements 5 with the piezoelectric terminals 34 can be improved.

According to the suspension board with circuit 1, as shown in FIG. 2, each of the base portion-cutout portions 52 and the stage cutout portions 62 in the tongue portion-insulating layer 40 is formed by cutting out the inner-side portion in the right-left direction of the tongue portion-insulating layer 40.

When the suspension board with circuit 1 swings in the right-left direction by stretching and shrinking of the piezoelectric elements 5, distortion in the right-left direction occurs between the piezoelectric elements 5 and the piezoelectric terminals 34.

According to the suspension board with circuit 1, the base portion-cutout portions 52 and the stage cutout portions 62 are formed by cutting out the base insulating layer 9 in the right-left direction, so that the distortion occurring in the right-left direction can be alleviated in the base portion-cutout portions 52 and the stage cutout portions 62.

According to the suspension board with circuit 1, as shown in FIG. 2, the piezoelectric terminals 34 include the second rear-side piezoelectric terminal portions 72 and the second front-side piezoelectric terminal portions 82 that protrude toward the base portion-cutout portions 52 and the stage cutout portions 62, respectively.

Thus, the bonded area of the piezoelectric terminals 34 can he further increased by the portion of protrusion of the second rear-side piezoelectric terminal portions 72 and the second front-side piezoelectric terminal portions 82 toward the base portion-cutout portions 52 and the stage cutout portions 62, respectively, in the piezoelectric terminals 34.

Thus, the connection reliability of the piezoelectric terminals 34 can be further improved.

According to the suspension board with circuit 1, as shown in FIG. 4, the end edges of the second rear-side piezoelectric terminal portions 72 and the second front-side piezoelectric terminal portions 82 in the piezoelectric terminals 34 axe, when projected in the up-down direction, disposed at the inner side in the right-left direction with respect to the end edge of the cover insulating layer 11 in the right-left direction.

When the end edge of the cover insulating layer 11 is, in the right-left direction, disposed at the inner side with respect to the end edges of the second rear-side piezoelectric terminal portions 72 and the second front-side piezoelectric terminal portions 82 in the piezoelectric terminals 34, the end edge of the cover insulating layer 11 is over the end edges of the second rear-side piezoelectric terminal portions 72 and the second front-side piezoelectric terminal portions 82 in the piezoelectric terminals 34, so that the cover insulating layer 11 is easily peeled from the piezoelectric terminals 34.

In the suspension board with circuit 1, the end edges of the second rear-side piezoelectric terminal portions 72 and the second front-side piezoelectric terminal portions 82 in the piezoelectric terminals 34 are, when projected in the up-down direction, disposed at the inner side with respect to end edge of the cover insulating layer 11 in the right-left direction, so that the end edge of the cover insulating layer 11 can be brought into tight contact with the piezoelectric terminals 34, thereby suppressing the peeling of the cover insulating layer 11 from the piezoelectric terminals 34.

7. Modified Examples

Each of the modified examples of the suspension board with circuit is described with reference to FIGS. 8A to 9B. In each of the modified examples, the same reference numerals are provided for members corresponding to each of those in the above-described embodiment, and their detailed description is omitted. In the description below, the opening portion, the cutout portion, and the piezoelectric terminal that are formed in the pair of rear-side stage insulating layers 56 are formed in the pair of front-side base portion-insulating layers 47 in the same configuration. Thus, as for the shapes of the opening portion, the cutout portion, and the piezoelectric terminal, the description of the pair of front-side base portion-insulating layers 47 is omitted by describing the pair of rear-side stage insulating layers 56.

(1) Second Embodiment

In the above-described first embodiment, as shown in FIG. 2, in the tongue portion-insulating layer 40, the base portion-cutout portions 52 and the stage cutout portions 62 are disposed at the inner side in the right-left direction.

In contrast, in the second embodiment, cutout portions 92 are disposed at the outer side in the right-left direction.

To be more specific, as shown in FIG. 8A, the inner-side end portion in the right-left direction of each of the rear-side stage insulating layers 56 is continuous to the central portion-insulating layer 43. An opening portion 91 and the cutout portion 92 are formed in each of the rear-side stage insulating layers 56.

The opening portion 91 is disposed at the central portion in the right-left direction in each of the rear-side stage insulating layers 56. The opening portion 91 is formed into a rectangular shape in plane view and passes through each of the rear-side stage insulating layers 56 along the up-down direction.

The cutout portion 92 is disposed at the outer-side portion in the right-left direction in each of the rear-side stage insulating layers 56. The cutout portion 92 is formed by cutting out each of the outer-side portions in the right-left direction of the rear-side stage insulating layers 56 along the right-left direction and is communicated with the opening portion 91.

In this manner, each of the rear-side stage insulating layers 56 is formed into a generally U-shape in plane view with the outer side in the right-left direction thereof open.

In each of the rear-side stage insulating layers 56, the piezoelectric terminal 34 fills the inside of the opening portion 91.

The piezoelectric terminals 34 include first terminal portions 101 and, as one example of a terminal free end portion and a protruding portion, second terminal portions 102.

Each of the first terminal portions 101 is formed into a generally rectangular shape in plane view and is disposed at the inside of the opening portion 91 so as to expose the lower surface thereof from the opening portion 91 of each of the rear-side stage insulating layers 56.

Each of the second terminal portions 102 is disposed at the outer side in the right-left direction with respect to the first terminal portion 101 to be continuous thereto. The second terminal portion 102 protrudes from the first terminal portion 101 toward the cutout portion 92. That is, the second terminal portion 102 is a free end portion of the outer side in the right-left direction of the piezoelectric terminal 34. To be more specific, the second terminal portion 102 expands in a generally circular arc shape in plane view from the central portion in the front-rear direction toward the outer side in the right-left direction at the outer-side end edge in the right-left direction of the first terminal portion 101.

In the second terminal portion 102, the upper, lower, and side surfaces thereof are exposed by the cutout portion 92, in other words, the upper, lower, and side surfaces thereof are opened from the rear-side stage insulating layer 56 by the cutout portion 92.

According to the suspension board with circuit 1 in the second embodiment, the cutout portion 92 is disposed at the outer side in the right-left direction in each of the rear-side stage insulating layers 56. The cutout portion 92 is formed by cutting out each of the outer-side portions in the right-left direction of the pair of rear-side stage insulating layers 56 along the right-left direction.

When the suspension board with circuit 1 swings in the right-left direction by stretching and shrinking of the piezoelectric elements 5, distortion at the outer side in the right-left direction, in particular, occurs between the piezoelectric elements 5 and the piezoelectric terminals 34.

In the suspension board with circuit 1, the cutout portions 92 are formed by cutting out the outer side in the right-left direction of the base insulating layer 9, so that the distortion that occurs at the outer side in the right-left direction can be alleviated in the base portion-cutout portions 52 and the stage cutout portions 62.

(2) Third Embodiment

In the above-described first embodiment, as shown in FIG. 2, the base portion-cutout portions 52 and the stage cutout portions 62 are disposed at the inner side in the right-left direction.

In contrast, in the third embodiment, a pair of cutout portions 112 is disposed at both outer sides in the right-left direction of each of opening portions 111.

To be more specific, as shown in FIG. 8B, the opening portion 111 and the pair of cutout portions 112 are formed in each of the rear-side stage insulating layers 56 in the tongue portion-insulating layer 40.

The opening portion 111 is disposed at the central portion in the right-left direction in each of the rear-side stage insulating layers 56. The opening portion 111 is formed into a rectangular shape in plane view and passes through each of the rear-side stage insulating layers 56 along the up-down direction.

The pair of cutout portions 112 is disposed to be adjacent to both ends of the opening portion 111 in the right-left direction in each of the rear-side stage insulating layers 56. Each of the cutout portions 112 is formed by cutting out each of both end portions in the right-left direction of the rear-side stage insulating layers 56 in the right-left direction and is communicated with the opening portion 111.

In this manner, each of the rear-side stage insulating layers 56 is formed of the front-side portion and the rear-side portion that are disposed at spaced intervals to each other in the front-rear direction.

In each of the rear-side stage insulating layers 56, the piezoelectric terminal 34 fills the inside of the opening portion 111.

The piezoelectric terminals 34 include first terminal portions 121 and, as one example of a terminal free end portion and a protruding portion, a pair of second terminal portions 122.

Each of the first terminal portions 121 is formed into a generally rectangular shape in plane view and is disposed at the inside of the opening portion 111 so as to expose the lower surface thereof from the opening portion 111 of each of the rear-side stage insulating layers 56.

Each of the second terminal portions 122 is disposed at both sides in the right-left direction with respect to the first terminal portion 121 to be continuous thereto. Each of the second terminal portions 122 protrudes from the first terminal portion 121 toward each of the cutout portions 112. That is, each of the second terminal portions 122 is a free end portion of both sides in the right-left direction of the piezoelectric terminal 34. To be more specific, each of the second terminal portions 122 expands in a generally circular arc shape in plane view from the central portion in the front-rear direction toward the inner side or the outer side in the right-left direction at the both side end edges in the right-left direction of the first terminal portion 121.

In each of the second terminal portions 122, the upper, lower, and side surfaces thereof are exposed by each of the cutout portions 112, in other words, the upper, lower, and side surfaces thereof are opened from the rear-side stage insulating layer 56 by each of the cutout portions 112.

According to the suspension board with circuit 1 in the third embodiment, the pair of cutout portions 112 is disposed at both ends of the opening portion 111 in the right-left direction in each of the rear-side stage insulating layers 56.

When the suspension board with circuit 1 swings in the right-left direction by stretching and shrinking of the piezoelectric elements 5, distortion at both sides in the right-left direction occurs between the piezoelectric elements 5 and the piezoelectric terminals 34.

In the suspension board with circuit 1, the pair of cutout portions 112 is disposed at both ends of the opening portion ill in the right-left direction, so that the distortion that occurs at both sides in the right-left direction can be alleviated in the pair of cutout portions 112.

Each of the cutout portions 112 opens each of the second terminal portions 1 rear-side stage insulating layer 56.

Thus, the bonded area of the piezoelectric terminals 34 can be further increased.

(3) Fourth Embodiment

In the above-described first embodiment, as shown in FIG. 2, the base portion-cutout portions 52 and the stage cutout portions 62 are disposed at the inner side in the right-left direction.

In contrast, in the fourth embodiment, a cutout portion 132 is disposed at the rear side in each of the rear-side stage insulating layers 56.

To be more specific, as shown in FIG 5C, the inner-side end portion in the right-left direction of each of the rear-side stage insulating layers 56 is continuous to the central portion-insulating layer 43. An opening portion 131 and the cutout portion 132 are formed in each of the rear-side stage insulating layers 56.

The opening portion 131 is disposed at the central portion in the right-left direction in each of the rear-side stage insulating layers 56. The opening portion 131 is fowled into a rectangular shape in plane view and passes through each of the rear-side stage insulating layers 56 along the up-down direction.

The cutout portion 132 is disposed at the rear-side portion in each of the rear-side stage insulating layers 56. The cutout portion 132 is formed by cutting out each of the rear-side portions of the rear-side stage insulating layers 56 along the front-rear direction and is communicated with the opening portion 131.

In this manner, each of the rear-side stage insulating layers 56 is formed into a generally U-shape in plane view with the rear side thereof open. In each of the rear-side portions of the rear-side stage insulating layers 56, the central portion in the right-left direction is opened with both end portions in the right-left direction remained.

In each of the rear-side stage insulating layers 56, the piezoelectric terminal 34 fills the inside of the opening portion 131.

The piezoelectric terminals 34 include first terminal portions 141 and, as one example of a terminal free end portion and a protruding portion, second terminal portions 142.

Each of the first terminal portions 141 is formed into a generally rectangular shape in plane view and is disposed at the inside of the opening portion 131 so as to expose the lower surface thereof from the opening portion 131 of each of the rear-side stage insulating layers 56.

Each of the second terminal portions 142 is disposed at the rear side with respect to the first terminal portion 141 to be continuous thereto. The second terminal portion 142 protrudes from the first terminal portion 141 toward the cutout portion 132. That is, the second terminal portion 142 is a free end portion of the rear side of the piezoelectric terminal 34. To be more specific, the second terminal portion 142 expands in a generally circular arc shape in plane view from the central portion in the right-left direction toward the rear side at the rear-side end edge of the first terminal portion 141.

In the second terminal portion 142, the upper, lower, and side surfaces thereof are exposed by the cutout portion 132, in other words, the upper, lower, and side surfaces thereof are opened from the rear-side stage insulating layer 56 by the cutout portion 132.

According to the suspension board with circuit 1 in the fourth embodiment, the cutout portion 132 is disposed at the rear side in each of the rear-side stage insulating layers 56. The cutout portion 132 is formed by cutting out each of the rear-side portions of the rear-side stage insulating layers 56 along the front-rear direction.

When the suspension board with circuit 1 swings in the right-left direction by stretching and shrinking of the piezoelectric elements 5, distortion at both sides in the right-left direction occurs between the piezoelectric elements 5 and the piezoelectric terminals 34.

In the suspension board with circuit 1, the cutout portion 132 is formed by cutting out each of the rear-side portions of the rear-side stage insulating layers 56 along the front-rear direction, so that the cutout portion 132 is disposed in a portion with less distortion.

Thus, the connection reliability of the second terminal portions 142 opened from the rear-side stage insulating layers 56 by the cutout portions 132 with respect to the piezoelectric elements 5 can be improved.

(4) Fifth Embodiment

In the above-described first embodiment, as shown in FIG. 2, the second front-side piezoelectric terminal portions 82 in the piezoelectric terminals 34 expand from the central portion in the front-rear direction toward the inner side in the right-left direction.

In contrast, in the fifth embodiment, second terminal portions 162 in the piezoelectric terminals 34 expand from the entire region in the front-rear direction toward the inner side in the right-left direction.

To be more specific, each of the second terminal portions 162 expands in a generally circular arc shape in plane view from the entire region in the front-rear direction toward the inner side in the right-left direction at the inner-side end edge in the right-left direction of a first terminal portion 161 disposed in each of the stage opening portions 61.

In the second terminal portion 162, the upper, lower, and side surfaces thereof are exposed by the stage cutout portion 62, in other words, the upper, lower, and side surfaces thereof are opened from the rear-side stage insulating layer 56 by the stage cutout portion 62.

According to the suspension board with circuit 1 in the fifth embodiment, the second terminal portion 162 expands in a generally circular arc shape in plane view from the entire region in the front-rear direction of the first terminal portion 161.

Thus, the bonded area of the piezoelectric terminals 34 can be further increased.

(5) Sixth Embodiment

In the above-described first embodiment, as shown in FIG. 2, the second front-side piezoelectric terminal portions 82 in the piezoelectric terminals 34 expand from the central portion in the front-rear direction toward the inner side in the right-left direction.

In contrast, in the sixth embodiment, the second front-side piezoelectric terminal portion 82 is not formed in the piezoelectric terminals 34.

To be more specific, as shown in FIG. 9A, the piezoelectric terminals 34 include the first front-side piezoelectric terminal portions 81 only. The inner-side end edge in the right-left direction of each of the first front-side piezoelectric terminal portions 81 extends in a linear shape along the front-rear direction. The inner-side end edge in the right-left direction of the first front-side piezoelectric terminal portion 81 is one example of a terminal free end portion.

According to the suspension board with circuit 1 in the sixth embodiment, the piezoelectric terminals 34 can be easily and surely formed.

Thus, the bonded area of the piezoelectric terminals 34 can be further increased, (6) Seventh Embodiment In the above-described first embodiment, as shown in FIG. 2, each of the piezoelectric terminals 34 is formed into a generally rectangular shape in plane view.

In contrast, in the seventh embodiment, the piezoelectric terminal 34 is formed into a generally circular plate shape in plane view.

To be more specific, as shown in FIG. 9B, each of the rear-side stage insulating layers 56 in the tongue portion-insulating layer 40 is formed into a generally circular plate shape in plane view. An opening portion 181 and a cutout portion 182 are formed in each of the rear-side stage insulating layers 56.

The opening portion 181 is disposed at the central portion in the right-left direction in each of the rear-side stage insulating layers 56. The opening portion 181 is formed into a generally circular shape in plane view and passes through each of the rear-side stage insulating layers 56 along the up-down direction.

The cutout portion 182 is disposed at the inner-side portion in the right-left direction in each of the rear-side stage insulating layers 56. The cutout portion 182 is formed by cutting out each of the inner-side portions in the right-left direction of the rear-side stage insulating layers 56 along the right-left direction and is communicated with the opening portion 181.

In each of the rear-side stage insulating layers 56, the piezoelectric terminal 34 fills the inside of the opening portion 181.

The piezoelectric terminal 34 is formed into a generally circular shape in plane view and includes a first terminal portion 191 and, as one example of a terminal free end portion and a protruding portion, a second terminal portion 192.

The first terminal portion 191 is formed into a generally circular plate shape in plane view and is disposed at the inside of the opening portion 181 so as to expose the lower surface thereof from the opening portion 181 of each of the rear-side stage insulating layers 56.

The second terminal portion 192 is disposed at the inner side in the right-left direction with respect to the first terminal portion 191 to be continuous thereto. The second terminal portion 192 protrudes from the first terminal portion 191 toward the cutout portion 182. That is, the second terminal portion 192 is a free end portion of the inner side in the right-left direction of the piezoelectric terminal 34. To be more specific, the second terminal portion 192 expands in a generally circular arc shape in plane view from the central portion in the front-rear direction toward the inner side in the fight-left direction at the inner-side end edge in the right-left direction of the first terminal portion 191.

In the second terminal portion 192, the upper, lower, and side surfaces thereof are exposed by the cutout portion 182, in other words, the upper, lower, and side surfaces thereof are opened from the rear-side stage insulating layer 56 by the cutout portion 182.

According to the suspension board with circuit 1 in the seventh embodiment, the piezoelectric terminal 34 is formed into a generally circular shape in plane view.

Thus, the piezoelectric terminal 34 can be stably connected to the piezoelectric element 5.

The cutout portion 182 may be disposed at the outer-side portion in the right-left direction as shown in A1, may be disposed at the rear side as shown in A2, or may be disposed at the front side.

In the piezoelectric terminal 34, the first terminal portion 191 only may be formed and the second terminal portion 192 may not be formed. In such a case, the inner-side end edge in the right-left direction of the first terminal portion 191 is one example of a terminal free end portion.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A suspension board with circuit comprising:
   a metal supporting board having a support opening portion passing through a thickness direction;
   a base insulating layer disposed on an upper surface of the metal supporting board and having an insulating opening portion passing through the thickness direction, when projected in the thickness direction, to be included in the support opening portion; and
   a conductive layer having a wire portion disposed on an upper surface of the base insulating layer and a terminal portion disposed in the insulating opening portion to be connected to an electronic element and connected to the wire portion, wherein
   the base insulating layer has a cutout portion obtained by cutting out the base insulating layer in a direction orthogonal to the thickness direction and continuous to and on a same level as the insulating opening portion, and
   the terminal portion includes a free end portion opened and exposed by the cutout portion.

2. The suspension board with circuit according to claim 1, wherein
   the electronic element is a piezoelectric element and the terminal portion is displaced by stretching and shrinking of the piezoelectric element.

3. The suspension board with circuit according to claim 1, wherein
the cutout portion is formed by cutting out at least one side of the base insulating layer in a widthwise direction orthogonal to both directions of a connection direction of the wire portion and the terminal portion and the thickness direction.

4. The suspension board with circuit according to claim 1, wherein
the cutout portion is formed by cutting out at least one side of the base insulating layer in a connection direction of the wire portion and the terminal portion.

5. The suspension board with circuit according to claim 1, wherein
the free end portion is a protruding portion that protrudes toward the cutout portion.

6. The suspension board with circuit according to claim 1 further comprising:
a cover insulating layer disposed to cover the conductive layer on the upper surface of the base insulating layer and
an end edge of the free end portion is, when projected in the thickness direction, disposed at a one direction-side with respect to an end edge of the cover insulating layer in one direction from the insulating opening portion toward the cutout portion.

7. The suspension board with circuit according to claim 1, wherein the free end portion expands in a generally circular arc shape in plane view toward the cutout portion.

8. The suspension board with circuit according to claim 1, wherein
the cutout portion is formed by cutting out at least one side of the base insulating layer in a widthwise direction orthogonal to a longitudinal direction of the suspension board with circuit and orthogonal to the thickness direction.

* * * * *